(12) United States Patent
Kang et al.

(10) Patent No.: US 6,438,042 B1
(45) Date of Patent: Aug. 20, 2002

(54) ARRANGEMENT OF BITLINE BOOSTING CAPACITOR IN SEMICONDUCTOR MEMORY DEVICE

(75) Inventors: Sang-Seok Kang; Yun-Sang Lee; Jong-Hyun Choi; Jae-Hoon Joo, all of Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/879,076

(22) Filed: Jun. 11, 2001

(30) Foreign Application Priority Data

Jan. 4, 2001 (KR) .............................................. 2001-347

(51) Int. Cl.$^7$ ................................................ G11C 7/00
(52) U.S. Cl. ........................ 365/190; 365/205; 365/207; 365/208
(58) Field of Search .................................. 365/190, 205, 365/207, 208

(56) References Cited

U.S. PATENT DOCUMENTS

| | | | | |
|---|---|---|---|---|
| 5,701,268 A | * | 12/1997 | Lee et al. | 365/205 |
| 6,137,737 A | * | 10/2000 | Mullarkey et al. | 365/205 |
| 6,226,207 B1 | * | 5/2001 | Suh | 365/205 |
| 6,246,604 B1 | * | 6/2001 | Lowrey | 365/205 |

* cited by examiner

*Primary Examiner*—Trong Phan
(74) *Attorney, Agent, or Firm*—Marger Johnson & McCollom, P.C.

(57) ABSTRACT

A semiconductor memory device includes first and second isolation transistors for electrically connecting/isolating a pair of bitlines to/from a sense amplifier circuit, and a MOS transistor having a source region that is shared with one of sources of the first and second isolation transistors. The MOS transistor may be used as a bitline boosting capacitor.

24 Claims, 4 Drawing Sheets

US 6,438,042 B1

ARRANGEMENT OF BITLINE BOOSTING CAPACITOR IN SEMICONDUCTOR MEMORY DEVICE

This application relies for priority upon Korean Patent Application No. 2001-347, filed on Jan. 4, 2001, the contents of which are incorporated herein by reference in their entirety.

FIELD OF THE INVENTION

The present invention relates to a semiconductor memory device and, more particularly, to an arrangement of a boosting capacitor that is used in a dynamic random access memory (DRAM).

BACKGROUND OF THE INVENTION

A part of a DRAM is illustrated in FIG. 1. In a memory cell 10, one end of a capacitor 11 is connected to a bitline BLB through a charge transfer transistor 12. In a memory cell 20, one end of a capacitor 21 is connected to a bitline BL through a charge transfer transistor 22. A plate potential Vp is applied to the other ends of the capacitors 11 and 21, respectively. Gates of the charge transfer transistors 12 and 22 are coupled to wordlines WL0 and WL1, respectively. When information of a memory cell (e.g., cell 10) is read out, the bitlines BL and BLB are set to a precharge potential. If the charge transfer transistor 12 is turned on for a predetermined time, a potential difference between the bitlines BL and BLB is amplified by a sense amplifier 30.

With scaling-down of circuit devices and lowering of operation voltages, potential change of a bitline has been attenuated in a read operation. Moreover, a ratio of a current leakage of a capacitor to an electric charge held at the capacitor increases. A current leakage occurring when a higher level "H" is held at a capacitor is greater than that occurring when a lower level "L" is held thereat. If the potential change is so small, a sense amplifier suffers from erroneous operations to output error data. Thus, an efficient margin is needed for the potential change to amplify a potential difference between bitlines, without the erroneous operations of the sense amplifier.

Source and drain of a MOS transistor 31 whose gate is coupled to a dummy wordline DWL0 are connected to a bitline BLB, while those of a MOS transistor 32 whose gate is coupled to a dummy wordline DWL1 are connected to a bitline BL. Each of the MOS transistors 31 and 32 acts as a capacitor, which is called a "bitline boosting capacitor". When the information of the memory cell 10 is read out, a potential of the wordline WL0 rises up to high level, to turn on the charge transfer transistor 12. At the same time, a potential of the dummy wordline DWL0 transitions from 0V to high level of a power supply voltage to complement a positive charge for the bitline BLB. Compensation of the attenuated potential change can be made through bitline boosting capacitors 31, 32, and a stable data sense margin can be secured therethrough.

Semiconductor memory devices with such a boosting capacitor are disclosed in U.S. Pat. No. 5,255,235 and U.S. Pat. No. 5,768,204.

In semiconductor memory devices, not only improvement of a data sense margin but also decrease in a chip size become significant factors of product competitiveness. And, significant factors to decrease in the chip size are achievement of a minute circuit linewidth and an optimal circuit arrangement. As described above, decrease in a chip size is inevitable with the use of a bitline boosting capacitor for improving a data sense margin. In order to suppress increase in the chip size with the use of the boosting capacitor, a method of efficiently arranging the bitline boosting capacitor in a limited area is required.

SUMMARY OF THE INVENTION

It is therefore an object of the invention to provide a semiconductor memory device with a boosting capacitor which is efficiently arranged.

According to an aspect of the present invention, a semiconductor memory device includes a memory cell array having a first bitline, a second bitline parallel with the first bitline, and memory cells connected to the first and second bitlines. A sense amplifier circuit senses a potential difference between the first and second bitlines. A first isolation transistor has a source region, a drain region, and a gate, and electrically connects/isolates the first bitline to/from the sense amplifier circuit. A second isolation transistor has a source region, a drain region, and a gate, and electrically connects/isolates the second bitline to/from the sense amplifier circuit. A MOS transistor has a source region and a gate, and is used as a boosting capacitor. The source region of the MOS transistor is formed such that it is shared with one of the source regions of the first and second isolation transistors. This saves, space, without compromising performance.

DESCRIPTION OF THE PREFERRED EMBODIMENT

Figure 1:
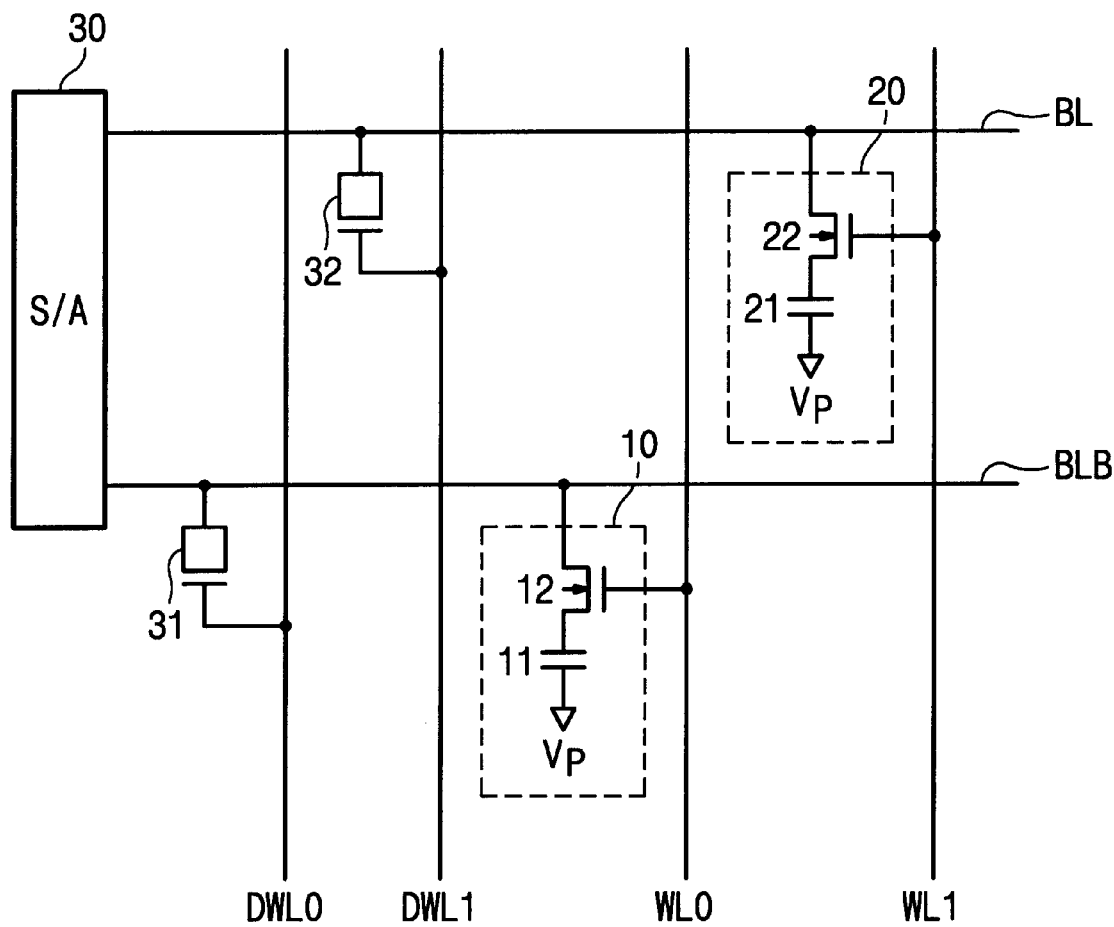
FIG. 1 is a circuit diagram showing a part of a semiconductor memory device, where the invention may be practiced.
Figure 2:
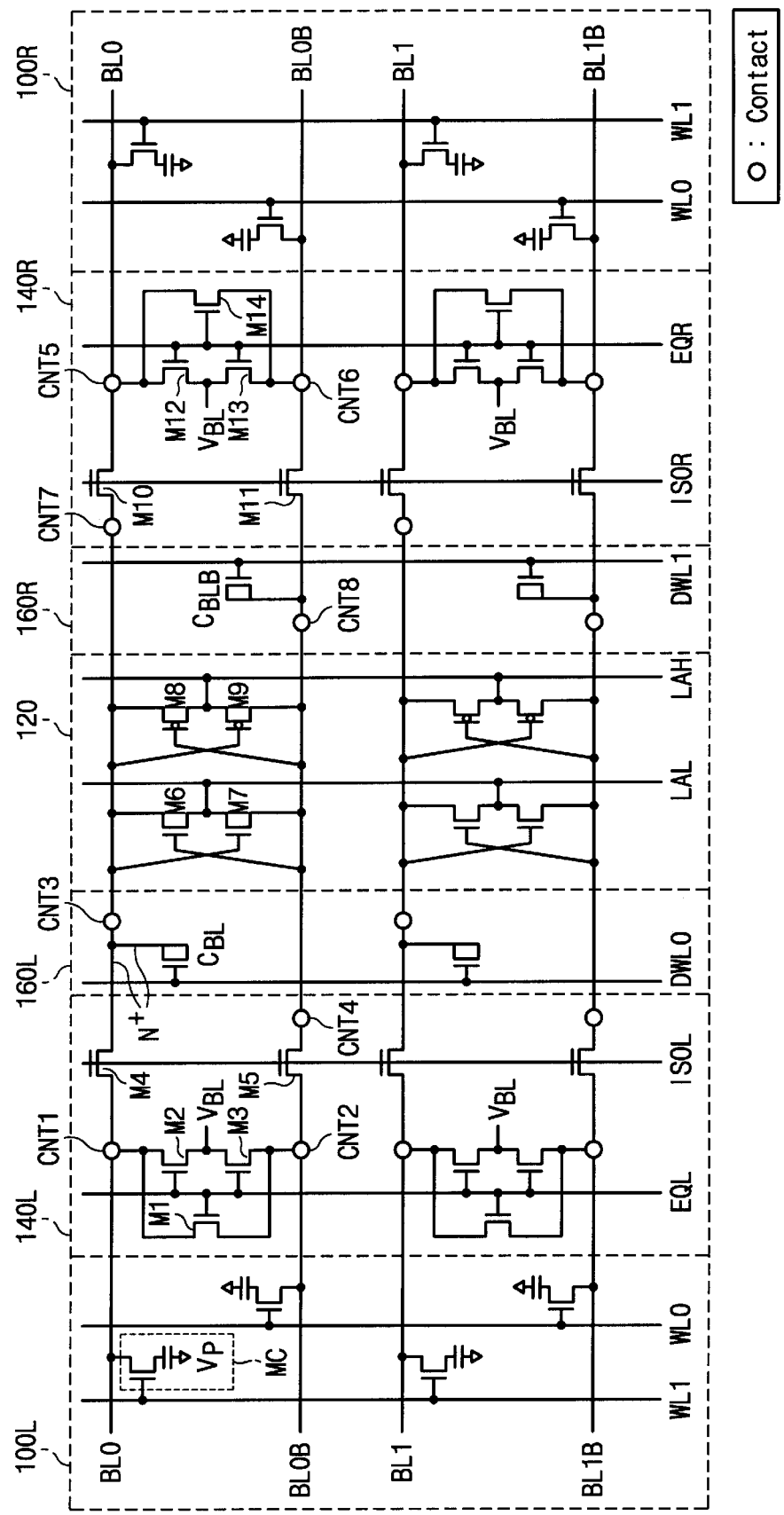
FIG. 2 is a block diagram showing a semiconductor memory device in accordance with the present invention.

A semiconductor memory device according to the present invention is schematically illustrated in FIG. 2. The semiconductor memory device, i.e., DRAM device includes a first memory cell array 100L and a second memory cell array 100R. A plurality of bitline pairs, wordlines intersecting the bitline pairs, and memory cells located at intersections of the bitline pairs and the wordlines are provided to each of the memory cells 100L and 100R. A sense amplify area is defined between the memory cells 100L and 100R. In the sense amplify area, bitline equalizing and isolating circuits and a sense amplifier circuit are formed.

For example, a bitline equalizing and isolating circuit 140L is arranged between the memory cell array 100L and the sense amplifier circuit 120. A bitline equalizing and isolating circuit 140R is arranged between the memory cell array 100R and the sense amplifier circuit 120. For simplicity of the description, only a construction of circuits associated with one bitline pair (e.g., BL0 and BL0B) will now be described hereinafter. Nonetheless, it is understood that circuits associated with the other bitline pairs may be made identical thereto, in construction and function. Sense amplifier 120, notwithstanding its individual parts, is considered to be the same unit for all the bitlines.

Sense amplifier circuit 120 is made of a P-latch sense amplifier and an N-latch sense amplifier. The N-latch sense amplifier is composed of two NMOS transistors M6 and M7, and couples one bitline of a relatively lower potential out of the bitlines BL0 and BL0B to a signal line LAL of a ground voltage. The P-latch sense amplifier is composed of two PMOS transistors M8 and M9, and couples one bitline of a relatively higher potential out of the bitlines BL0 and BL0B to a signal line LAH of a power supply voltage.

The bitline equalizing and isolating circuit 140L is made of five NMOS transistors M1–M5. Based upon an equalizing control signal EQL, the NMOS transistors M1–M3 are used to precharge and equalize a corresponding pair of bitlines BL0 and BL0B arranged in the memory cell array 100L to a bitline voltage $V_{BL}$. Based upon an isolating control signal, ISOL the NMOS transistors M4 and M5 are used to electrically connect/isolate the corresponding pair of bitlines BL0 and BL0B to/from the sense amplifier circuit 120.

Drains of the NMOS transistors M4 and MS are electrically connected to bitlines BL0 and BL0B arranged in the memory cell array 100R through "O"-mark contacts (or bitline-$N^+$ active contacts) CNT1 and CNT2, respectively. Sources of the NMOS transistors M4 and M5 are connected to conductive lines L1 and L2 through "O"-mark contacts (or bitline-$N^+$ active contacts) CNT3 and CNT4, respectively. That is, the bitlines BL0 and BL0B are connected to the sense amplifier circuit 120 through the conductive lines L1 and L2, when the NMOS transistors M4 and M5 are turned on.

Similar to the circuit 140L, the bitline and equalizing and isolating circuit 140R is made of five NMOS transistors M10–M14. Based upon an equalizing control signal EQR, the NMOS transistors M12–M14 are used to precharge and equalize a corresponding pair of bitlines BL0 and BL0B arranged in the memory cell array 100R to a bitline voltage $V_{BL}$. Based upon an isolating control signal ISOR, the NMOS transistors M10 and M11 are used to electrically connect/isolate the corresponding bitlines BL0 and BL0B to/from the sense amplifier circuit 120.

Drains of the NMOS transistors M10 and M11 are electrically connected to the bitlines BL0 and BL0B arranged in the memory cell array 100R through "O"-mark contacts (or bitline-$N^+$ active contacts) CNTS and CNT6, respectively. Sources of the NMOS transistors M10 and M11 are connected to conductive lines L1 and L2 through "O"-mark contacts (or bitline-$N^+$ active contacts) M10 and M11, respectively. That is, the bitlines arranged in the memory cell array 100R are connected to the sense amplifier circuit 120 through the conductive lines L1 and L2 when the NMOS transistors M10 and M11 are turned on.

It will be appreciated that, due to the other components, bitlines BL0, BL0B may be interrupted. For example, in FIG. 2 bitlines BL0, BL0B may have a "left" side and a "right" side.

Continuing to refer to FIG. 2, the DRAM device further includes bitline boosting capacitor areas 160L and 160R alongside sense amplifier circuit 120. Bitline boosting capacitor area 160L is located between sense amplifier circuit 120 and the bitline equalizing and isolating circuit 140L. Bitline boosting capacitor area 160L is located between sense amplifier circuit 120 and bitline equalizing and isolating circuit 140R.

In area 160L, a bitline boosting capacitor $C_{BL}$ is formed to compensate a positive charge for the bitline BL0 (or the conductive line L1) arranged in the memory cell array 100L. In area 160R, a bitline boosting capacitor $C_{BLB}$ is formed to compensate a positive charge for the bitline BL0B (or the conductive line L2) arranged in the memory cell array 100R.

Each of the boosting capacitors $C_{BL}$ and $C_{BLB}$ may be constructed using an N-type MOS transistor having a source, a drain, and a gate. A source (or $N^+$ active region) of a MOS transistor corresponding to the capacitor $C_{BL}$ is formed (or laid out), being shared with a source (or $N^+$ active region) of an NMOS transistor M4 for isolating a bitline. A source (or $N^+$ active region) of a MOS transistor corresponding to the capacitor $C_{BLB}$ is formed (or laid out), being shared with a source (or $N^+$ active region) of an NMOS transistor M11 for isolating a bitline.

Figure 3:
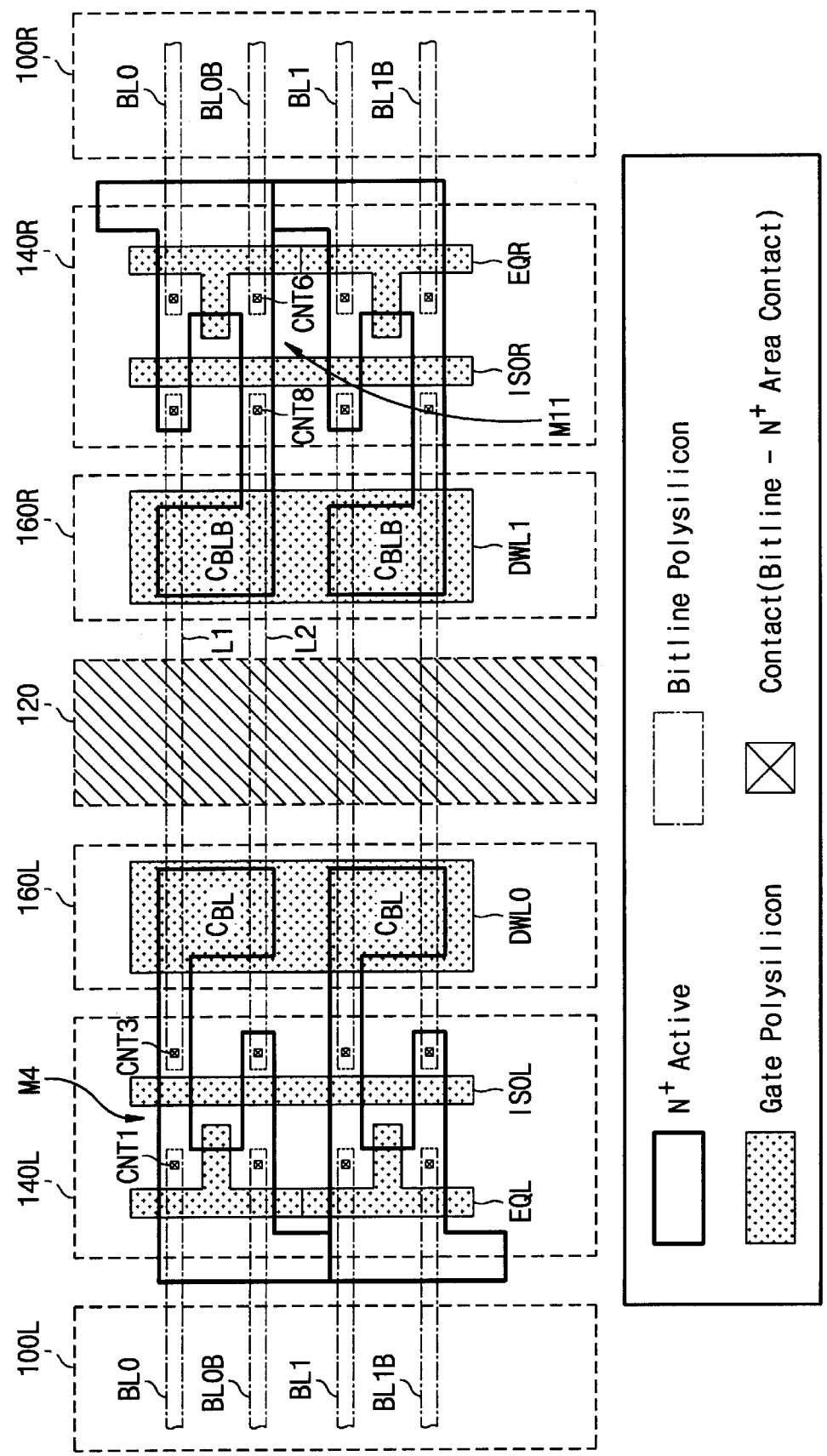
FIG. 3 is a diagram showing one arrangement of a bitline boosting capacitor shown in FIG. 2.

A first possible arrangement of a bitline boosting capacitor is illustrated in FIG. 3.

Thick lines represent $N^+$ active regions, in which NMOS transistors composing a bitline equalizing and isolating circuit are formed.

A left side of bitline BL0 is electrically connected to a drain region (or $N^+$ active region) of a bitline isolation transistor M4 through a bitline-drain contact CNT1. A source region of the bitline isolation transistor M4 is connected to a conductive line L1 by the bitline-source contact CNT3. The conductive line L1 is coupled to a sense amplifier circuit 120. Using polysilicon, the bitline BL0 and the conductive line L1 may be forrned at the same layer. The $N^+$ active region extends to bitline boosting capacitor area 160L, so that one end of the active region may be limited to a gate DWL0 region of a MOS transistor for a boosting capacitor $C_{BL}$. A drain region of MOS transistor M4 is not shown. An active region in bitline boosting capacitor area 160L is defined so that it may be formed within an area in which a pair of bitlines are arranged.

A right side of bitline BL0B is electrically connected to a drain region (or $N^+$ active region) of a bitline isolation transistor M11 through a bitline-drain contact CNT6. A source region (or $N^+$ active region) of the transistor M11 is connected to a conductive line L2 by a bitline-source contact CNT8. The conductive line L2 is coupled to the sense amplifier circuit 120. Using polysilicon, the bitline BL0B and the conductive line L2 may be formed at the same layer. The $N^+$ active region extends to a bitline boosting capacitor area 160R, so that one end of the active region may be limited to a gate DWL1 region of a MOS transistor for boosting capacitor $C_{BLB}$. A drain region of MOS transistor M11 is not shown. An active region in bitline boosting capacitor area 160R is defined so that it may be formed within in an area in which a pair of bitlines are arranged.

According to such a layout, a source region (or $N^+$ active region) of a MOS transistor for a boosting capacitor is shared with a source region (or $N^+$ active region) of a bitline isolation transistor. This saves space. The source (or $N^+$ active region) of the MOS transistor is connected to a conductive line L1/L2 and a bitline BL0/BL0B through a shared bitline-source contact CNT3/CNT8.

In FIG. 3, on the basis of a bitline direction, a gate DWL0/DWL1 region of a MOS transistor for a boosting capacitor is defined to be wider than an active region.

Figure 4:
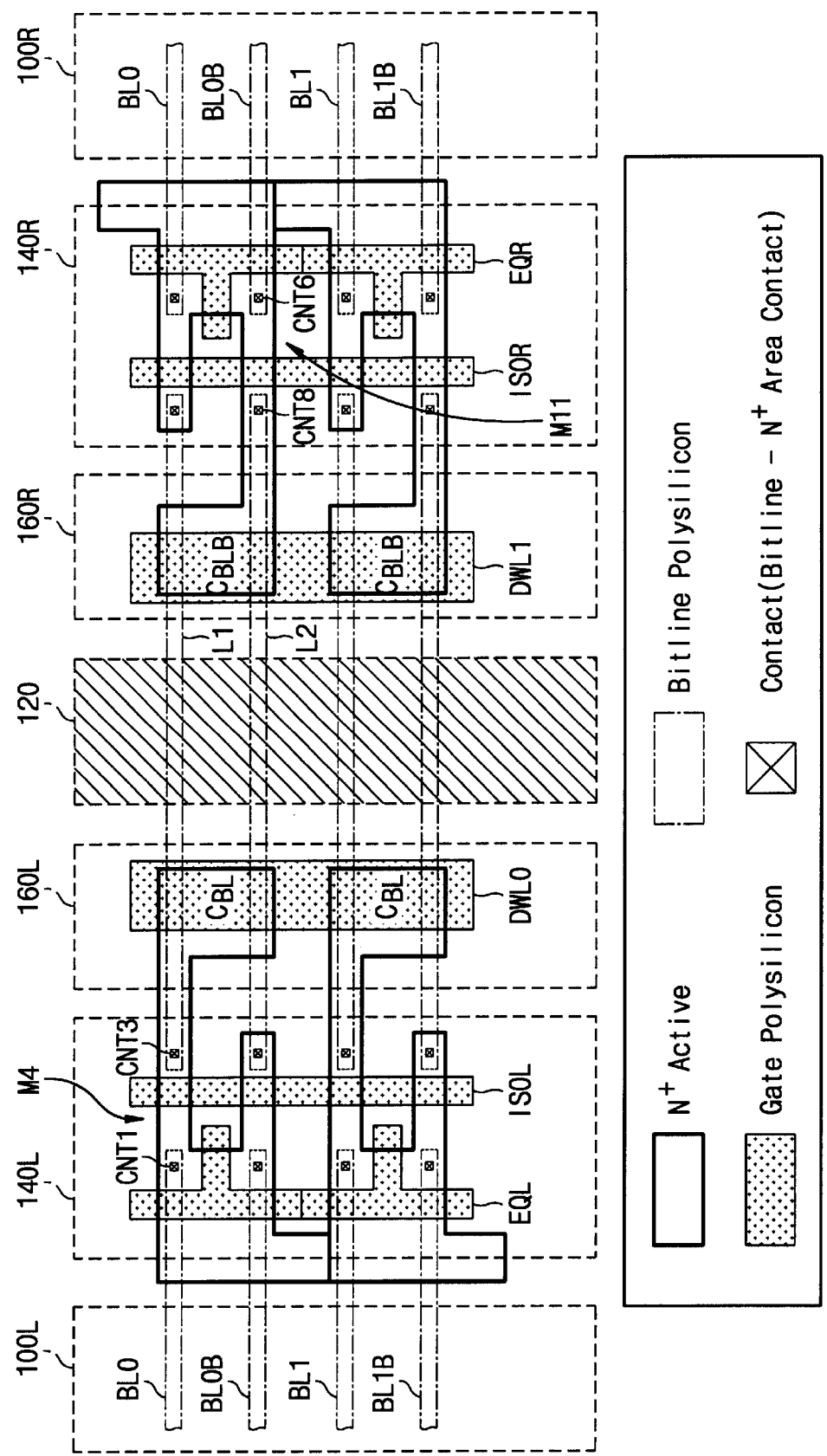
FIG. 4 is a diagram showing another arrangement of the bitline boosting capacitor shown in FIG. 2.

Another arrangement is shown in FIG. 4. On the basis of a bitline direction, a gate DWL0/DWL1 region of a MOS transistor for a boosting capacitor is narrower than an active region.

As described in the foregoing, a source region of a MOS transistor for a boosting capacitor is shared with that of a bitline isolation transistor, minimizing an occupied area of the MOS transistor. Furthermore, the source region of the NMOS transistor shares a contact formed at the source of the bitline isolation transistor, without forming a separate contact for coupling the source region of the MOS transistor to a bitline, thus rendering a contact area for the MOS transistor useless.

Although a preferred embodiment of the present invention has been described, it is to be understood that the invention is not limited thereto and that various changes and modifications may be made without departing from the spirit and scope of the invention.

What is claimed is:

1. A semiconductor memory device comprising:
   a memory cell array having a first bitline, a second bitline parallel with the first bitline, and memory cells coupled to the first and second bitlines,
   a sense amplifier circuit for sensing a potential difference between the first and second bitlines;
   a first isolation transistor for electrically connecting/isolating the first bitline to/from the sense amplifier circuit, the first isolation transistor having a source region, a drain region, and a gate;
   a second isolation transistor for electrically connecting/isolating the second bitline to/from the sense amplifier circuit, the second isolation transistor having a source region, a drain region, and a gate; and
   a MOS transistor having a source region that coincides with the source region of one of the first and second isolation transistors.

2. The device as claimed in claim 1, wherein the MOS transistor is used as a boosting capacitor.

3. The device as claimed in claim 1, wherein an active region of the MOS transistor is formed such that it is confined between a gate region of the MOS transistor and a side of the sense amplifier circuit.

4. The device as claimed in claim 1, wherein the MOS transistor is located between a layout area of the first and second isolation transistors and a layout area of the sense amplifier circuit.

5. The device as claimed in claim 1, wherein the MOS transistor is formed in an area in which the first and second bitlines are arranged.

6. The device as claimed in claim 1, further comprising:
   a second memory cell array having a third bitline, a fourth bitline parallel with the third bitline, and memory cells coupled to the third and fourth bitlines;
   a third isolation transistor for electrically connecting/isolating the third bitline to/from the sense amplifier circuit, the third isolation transistor having a source region, a drain region, and a gate;
   a fourth isolation transistor for electrically connecting/isolating the fourth bitline to/from the sense amplifier circuit, the third isolation transistor having a source region, a drain region, and a gate; and
   a second MOS transistor having a source region that coincides with the source region of one of the third and fourth isolation transistors.

7. The device as claimed in claim 6, wherein the second MOS transistor is used as a boosting capacitor.

8. The device as claimed in claim 6, wherein an active region of the second MOS transistor is formed such that it is confined between the gate region of the MOS transistor and a side of the sense amplifier circuit.

9. The device as claimed in claim 6, wherein the MOS transistor is located between a layout area of the third and fourth isolation transistors and a layout area of the sense amplifier circuit.

10. The device as claimed in claim 6, wherein the second MOS transistor is formed in an area in which the third and fourth bitlines are arranged.

11. A semiconductor memory device comprising:
    a memory cell array having a first bitline, a second bitline parallel with the first bitline, and memory cells coupled to the first and second bitlines;
    a sense amplifier circuit for sensing a potential difference between the first and second bitlines;
    a first isolation transistor for electrically connecting/isolating the first bitline to/from the sense amplifier circuit through a first conductive line, the first isolation transistor having a source region, a drain region, and a gate;
    a second isolation transistor for electrically connecting/isolating the second bitline to/from the sense amplifier circuit through a second conductive line, the second isolation transistor having a source region, a drain region, and a gate; and
    a MOS transistor having a source region and a gate, the source region being shared with one of the source regions of the first and second isolation transistors,
    wherein the first conductive line is electrically connected to the source region of the first isolation transistor via a first contact, and the second conductive line is electrically connected to the source region of the second isolation transistor via a second contact.

12. The device as claimed in claim 11, wherein the MOS transistor is used as a boosting capacitor.

13. The device as claimed in claim 11, wherein an active region of the MOS transistor is formed such that it is confined between a gate region of the MOS transistor and a side of the sense amplifier circuit.

14. The device as claimed in claim 11, wherein the MOS transistor is located between a layout area of the first and second isolation transistors and a layout area of the sense amplifier circuit.

15. The device as claimed in claim 11, wherein the MOS transistor is formed in an area in which the first and second bitlines are arranged.

16. The device as claimed in claim 11, further comprising:
    a second memory cell array having a third bitline, a fourth bitline parallel with the third bitline, and memory cells coupled to the third and fourth bitlines;
    a third isolation transistor for electrically connecting/isolating the third bitline to/from the sense amplifier circuit, the third isolation transistor having a source region, a drain region, and a gate;
    a fourth isolation transistor for electrically connecting/isolating the fourth bitline to/from the sense amplifier circuit, the third isolation transistor having a source region, a drain region, and a gate; and
    a second MOS transistor having a source region and a gate, the source region being shared with one of the source regions of the third and fourth isolation transistors.

17. The device as claimed in claim 16, wherein the second MOS transistor is used as a boosting capacitor.

18. The device as claimed in claim 16, wherein an active region of the second MOS transistor is formed such that it is confined between the gate region of the MOS transistor and a side of the sense amplifier circuit.

19. The device as claimed in claim 16, wherein the second MOS transistor is located between a layout area of the third and fourth isolation transistors and a layout area of the sense amplifier circuit.

20. The device as claimed in claim 16, wherein the second MOS transistor is formed in an area in which the third and fourth bitlines are arranged.

21. A semiconductor memory device comprising:
    a first memory cell array having a first bitline, a second bitline parallel with the first bitline, and memory cells coupled to the first and second bitlines;

a second memory cell array having a third bitline, a fourth bitline parallel with the third bitline, and memory cells coupled to the third and fourth bitlines;

a sense amplifier circuit for sensing a potential difference between the first and second bitlines and between the third and fourth bitlines;

a first isolation transistor for electrically connecting/isolating the first bitline to/from the sense amplifier circuit through a first conductive line, the first isolation transistor having a source region, a drain region, and a gate;

a second isolation transistor for electrically connecting/isolating the second bitline to/from the sense amplifier circuit through a second conductive line, the second isolation transistor having a source region, a drain region, and a gate;

a third isolation transistor for electrically connecting/isolating the third bitline to/from the sense amplifier circuit, the third isolation transistor having a source region, a drain region, and a gate;

a fourth isolation transistor for electrically connecting/isolating the fourth bitline to/from the sense amplifier circuit, the fourth isolation transistor having a source region, a drain region, and a gate;

a first MOS transistor having a source region and a gate, the source region being shared with the source region of the first isolation transistor; and a second MOS transistor having a source region and a gate, the source region being shared with the source region of the fourth isolation transistor.

22. The device as claimed in claim 21, wherein the first and second MOS transistors are used as boosting capacitors.

23. The device as claimed in claim 21, wherein the first and second MOS transistors are formed in an area in which the first and third bitlines are arranged, respectively.

24. The device as claimed in claim 21, wherein the first and second MOS transistors are formed in an area in which the second and fourth bitlines are arranged, respectively.

* * * * *

UNITED STATES PATENT AND TRADEMARK OFFICE
CERTIFICATE OF CORRECTION

PATENT NO.   : 6,438,042 B1
DATED        : August 20, 2002
INVENTOR(S)  : Kang et al.

It is certified that error appears in the above-identified patent and that said Letters Patent is hereby corrected as shown below:

Column 3,
Line 42, "CNTS" should read -- CNT5 --;

Column 4,
Line 10, "transistor M11" should read -- transistor M1 --;

Column 5,
Line 10, "bitlines," should read -- bitlines; --.

Signed and Sealed this

Twenty-ninth Day of April, 2003

JAMES E. ROGAN
*Director of the United States Patent and Trademark Office*